United States Patent
Clarke et al.

(10) Patent No.: US 7,253,083 B2
(45) Date of Patent: Aug. 7, 2007

(54) METHOD OF THINNING A SEMICONDUCTOR STRUCTURE

(75) Inventors: Rowland C. Clarke, Sykesville, MD (US); Erica C. Elvey, Owings Mills, MD (US); Silai V. Krishnaswamy, Monroeville, PA (US); Jeffrey D. Hartman, Severn, MD (US)

(73) Assignee: Northrop Grumman Corporation, Los Angeles, CA (US)

( * ) Notice: Subject to any disclaimer, the term of this patent is extended or adjusted under 35 U.S.C. 154(b) by 115 days.

(21) Appl. No.: 11/154,641

(22) Filed: Jun. 17, 2005

(65) Prior Publication Data

US 2006/0286767 A1    Dec. 21, 2006

(51) Int. Cl.
*H01L 21/30* (2006.01)
*H01L 21/46* (2006.01)

(52) U.S. Cl. .................. 438/459; 438/455; 438/458; 438/977; 257/21.485

(58) Field of Classification Search ............... 438/455, 438/458, 459
See application file for complete search history.

(56) References Cited

U.S. PATENT DOCUMENTS

| | | |
|---|---|---|
| 5,786,242 A | 7/1998 | Takemura et al. |
| 6,838,332 B1* | 1/2005 | Sanchez et al. ............ 438/239 |
| 2003/0161027 A1 | 8/2003 | Kurosawa et al. |
| 2005/0068627 A1 | 3/2005 | Nakamura et al. |
| 2005/0098840 A1* | 5/2005 | Fuertsch et al. ............ 257/414 |
| 2005/0208694 A1* | 9/2005 | Yue et al. .................... 438/31 |

FOREIGN PATENT DOCUMENTS

WO    WO-2004/017371 A2    2/2004

OTHER PUBLICATIONS

Fabrication and Characterization of Micromachined High-Frequency Tonpilz Transducers Derived by PZT Thick Films, Zhou et al., IEEE Transactions on Ultrasonics, Ferroelectrics, and Frequency Control, vol. 52, No. 3, Mar. 2005, pp. 350-357.

* cited by examiner

*Primary Examiner*—Michael Lebentritt
*Assistant Examiner*—Angel Roman
(74) *Attorney, Agent, or Firm*—Birch, Stewart, Kolasch & Birch, LLP

(57) ABSTRACT

First and second semiconductor wafers are bonded together, with at least one of the wafers having a first layer of silicon, an intermediate oxide layer and a second layer of silicon. The first silicon layer is initially mechanically reduced by around 80% to 90% of its thickness. The remaining silicon layer is further reduced by a plasma etch which may leave an uneven thickness. With appropriate masking the uneven thickness is made even by a second plasma etch. Remaining silicon is removed by a dry etch with XeF2 or BrF3 to expose the intermediate oxide layer. Prior to bonding, the semiconductor wafers may be provided with various semiconductor devices to which electrical connections are made through conducting vias formed through the exposed intermediate oxide layer.

14 Claims, 5 Drawing Sheets

METHOD OF THINNING A SEMICONDUCTOR STRUCTURE

BACKGROUND OF THE INVENTION

1. Field of the Invention

The invention in general relates to reducing the thickness of certain semiconductor structures.

2. Description of Related Art

In the field of semiconductor device fabrication it is often desired to remove a semiconductor layer from an adjacent layer of other material. For example, the semiconductor layer may be of silicon and the adjacent layer may be of an oxide of silicon, such as silicon dioxide. This type of arrangement is found in an SOI (silicon on insulator) structure which includes a base layer of silicon adjacent to an intermediate layer of silicon dioxide and a top layer of silicon.

Several methods are used or have been proposed for the removal of the base silicon layer. These include plasma etching, grinding, lapping and wet chemical etching. Plasma etching has been demonstrated with fluorine and chlorine based etchants. These etchants however, have a relatively low selectivity to the oxide, for example 100:1. Otherwise stated, these etchants will etch through the silicon at a rate X, and through the silicon dioxide at a rate Y, where X/Y is 100. This makes it difficult to stop the etching process when the oxide layer is reached. Grinding and lapping leaves an objectionable and unacceptable rough surface leading to uneven subsequent etching.

Wet etches include the use of potassium hydroxide, tetramethyl ammonium hydroxide and hydrofluoric/nitric acids. Some of these etchants have a better selectivity to the silicon dioxide, however they attack the edges of the semiconductor structure, even if a protective coating is applied. This leads to objectionable rough edges and microcracks in the structure.

It is a primary object of the present invention to obviate the drawbacks of the conventional thinning processes currently used.

SUMMARY OF THE INVENTION

A method of thinning a semiconductor structure is presented which comprises the steps of providing a first semiconductor structure having a first layer of silicon, an intermediate layer of an oxide of silicon and a third layer of silicon. A second semiconductor structure having a surface is also provided. A coating is placed on the surface of the third layer of silicon and on the surface of the second semiconductor structure. The two semiconductor structures are then bonded together at the coatings. Around 80% to 90% of the first layer of silicon is mechanically removed and the remaining first layer is subjected to a plasmaless dry etch of a fluorine containing compound to remove any remaining first silicon layer and to expose the surface of the intermediate layer of oxide. After the removal of the 80% to 90% of the silicon the remaining silicon may be given a first plasma etch prior to the plasmaless dry etch. Alternatively, after the first plasma etch the structure may be subject to a second plasma etch to even out any thickness differences in the silicon layer remaining. If desired, various semiconductor devices may be incorporated into one or both of the semiconductor structures.

Further scope of applicability of the present invention will become apparent from the detailed description provided hereinafter. It should be understood, however, that the detailed description and specific example, while disclosing the preferred embodiment of the invention, is provided by way of illustration only, since various changes and modifications within the spirit and scope of the invention will become apparent to those skilled in the art, from the detailed description.

BRIEF DESCRIPTION OF THE DRAWINGS

The present invention will become more fully understood from the detailed description provided hereinafter and the accompanying drawings, which are not necessarily to scale, and are given by way of illustration only, and wherein.

DESCRIPTION OF THE PREFERRED EMBODIMENT

Figure 1A:
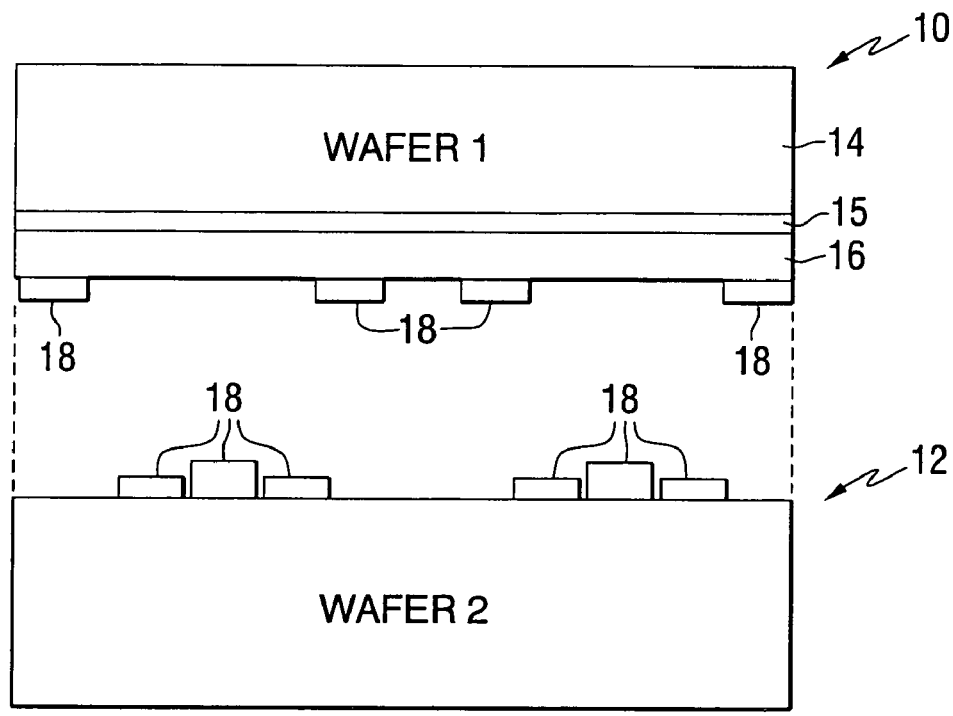
FIGS. 1A through 1G illustrate an example of the process of the present invention.

FIG. 1A illustrates a first semiconductor wafer 10 adjacent a second semiconductor wafer 12. Semiconductor wafer 10 is an SOI structure which includes a first layer 14 of silicon, an intermediate layer 15 of silicon dioxide and a third layer 16 of silicon. The second semiconductor wafer 12 may also be an SOI structure, but is illustrated as a bulk semiconductor. A plurality of semiconductor devices 18 are fabricated on at least one of the wafers. FIG. 1A illustrates semiconductor devices 18 on the facing surfaces of both wafers 10 and 12, although the inventive process is also applicable to wafers without such semiconductor devices.

Figure 1B:
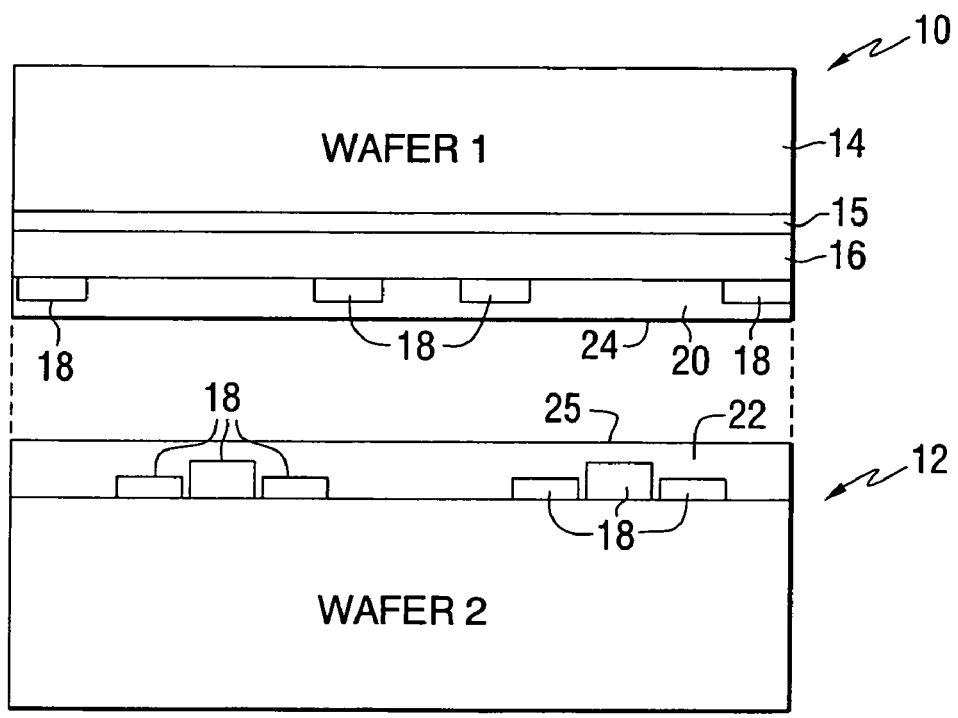

As illustrated in FIG. 1B, the facing surfaces of the two wafers 10 and 12 are covered with respective coatings 20 and 22, of a predetermined material, which may be an oxide, and which are subsequently chemically or mechanically polished to provide ultra smooth facing oxide surfaces 24 and 25.

Figure 1C:
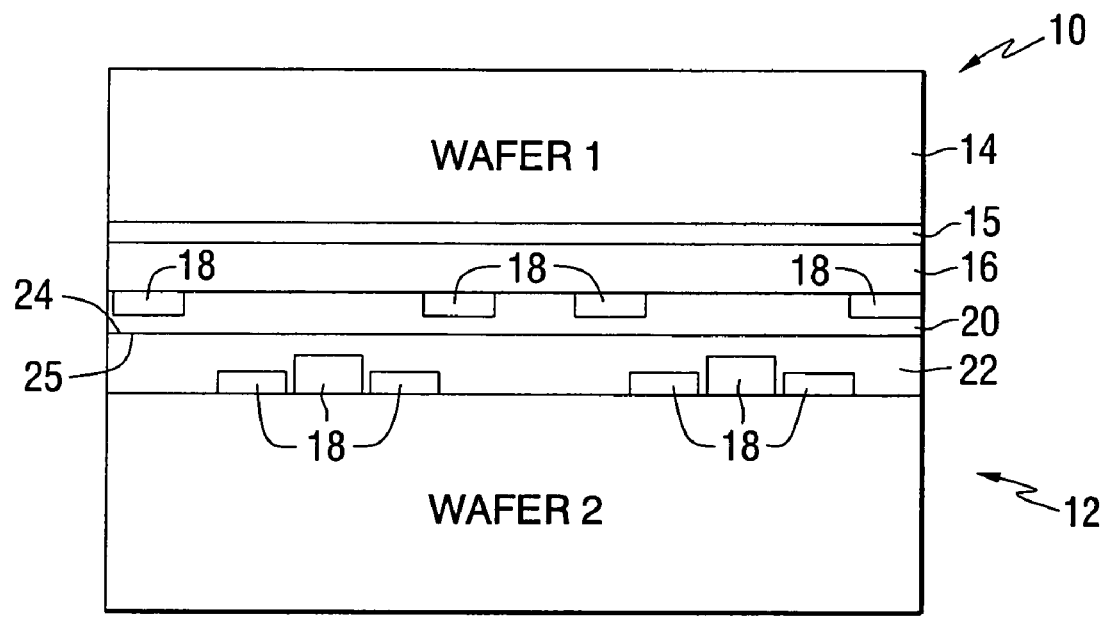

The ultra smooth facing oxide surfaces 24 and 25 are joined together, as illustrated in FIG. 1C, where, after an annealing process they become covalently bonded together.

Figure 1D:
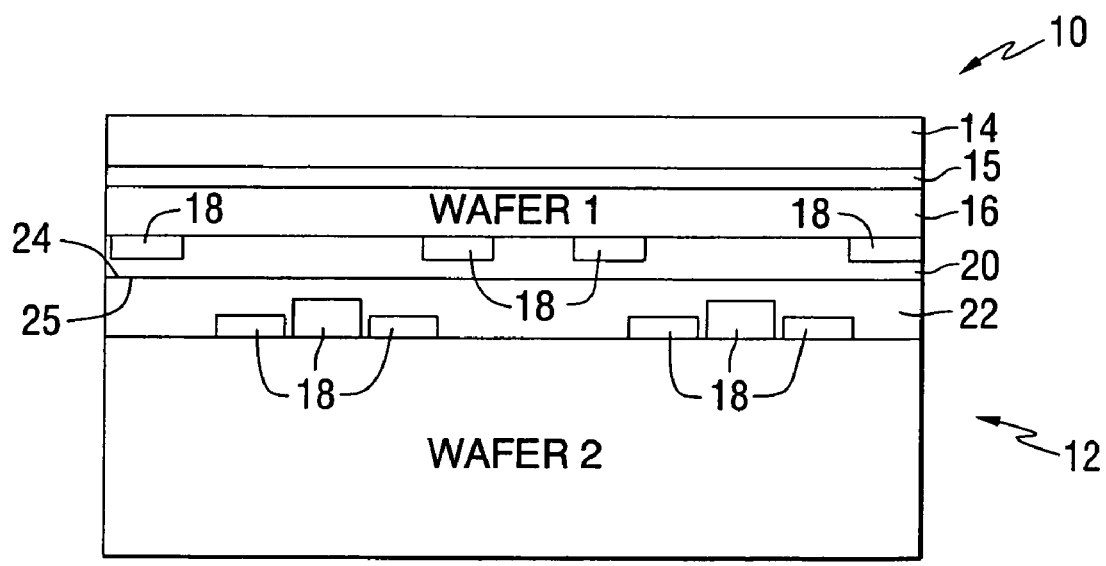

The next step in the process, as illustrated in FIG. 1D, involves the removal of approximately 80% to 90% of the silicon layer 14. This may be accomplished mechanically by a grinding or lapping procedure, by way of example, after which the wafer is cleaned. At this point the wafer may be placed into a chamber where a plasmaless dry etching of the wafer with a fluorine-containing compound is conducted to remove the remaining silicon. Such fluorine-containing compound may be $XeF_2$ (xenon difluoride) or $BrF_3$ (bromine trifluoride), by way of example.

Figure 1E:
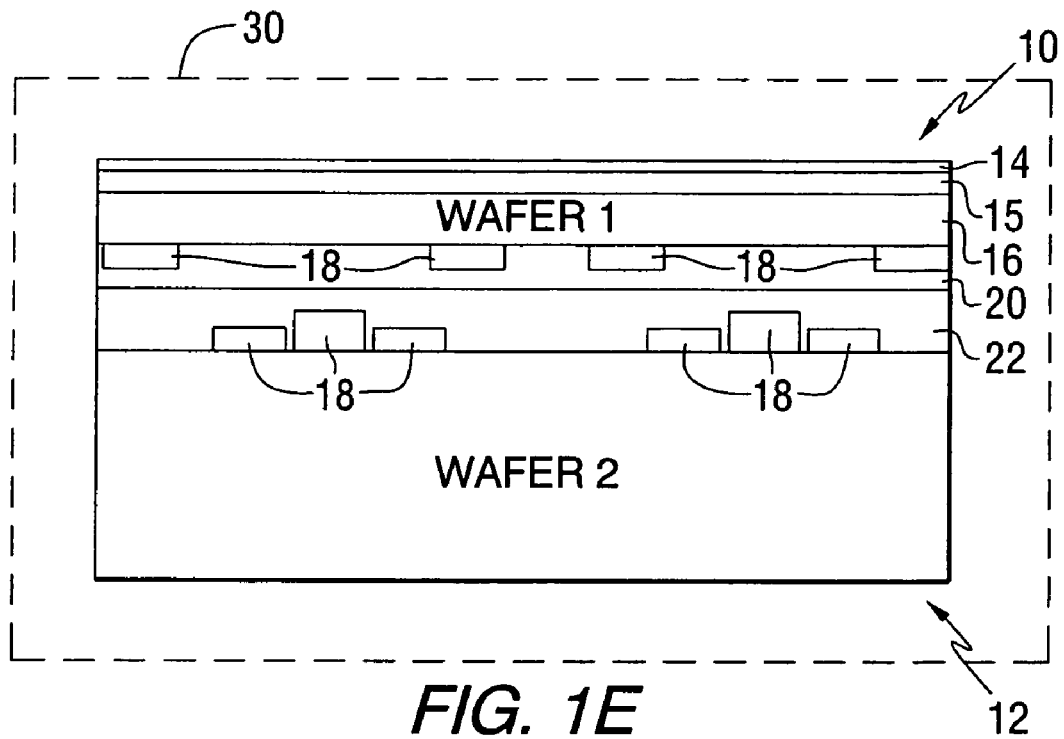

A preferred method, however, and as indicated in FIG. 1E, places the wafer structure into a chamber 30 where it is plasma etched before dry etching, such as by an RIE (reactive ion etch) or ICP (inductively coupled plasma) in fluorine. This operation is performed until the silicon layer 14 is reduced to no less than around 10 mm (microns) in thickness. Typically the reduction is such that the final thickness of silicon layer 14 of this step will be in the range of around 10 to 25 mm. A consequence of this operation however, is that the outer area of the wafer will be etched more than an inner area. For example, reference is made to FIG. 2, which shows a plan view of the wafer 12.

Figure 2:
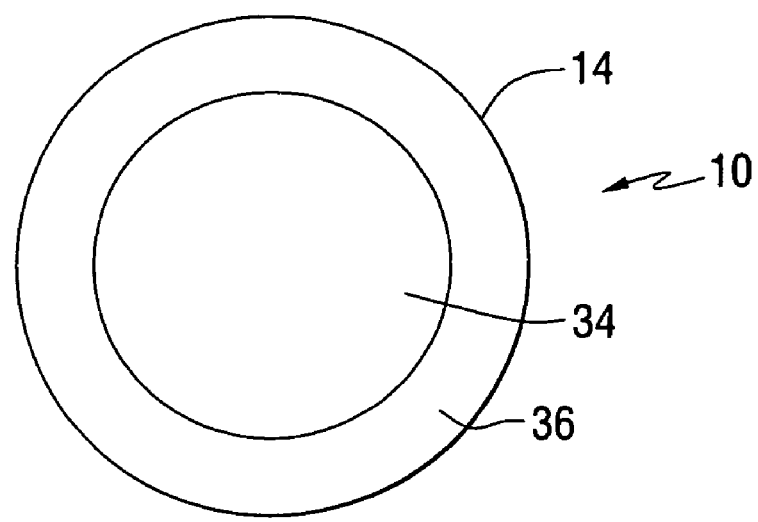
FIG. 2 is a plan view of a wafer structure.

In FIG. 2, the fluorine etching of the plasma etch leaves a central area 34 of one thickness and a surrounding annular area 36 of a thickness less than that of the central area 34. This structure may be placed into a chamber for the plasmaless etching with the aforementioned XeF2 or BrF3 to remove the remaining silicon. The exposed oxide resulting from this step will likewise have a central area thicker than an annular area, however this may be perfectly acceptable for certain intended applications.

If a uniform oxide thickness is required, then the silicon thickness may be made uniform. This may be accomplished by applying a resist to the surface of the wafer 10 and then by photolithographic means the central area of the resist is removed corresponding to central area 34. A plasma etch, for example RIE or ICP, with chlorine then etches just the central portion 34 until the silicon layer is of uniform thickness, after which the remaining resist is removed. Chlorine is selected in view of the fact that it is a slower etch process and allows for greater control.

Figure 1F:
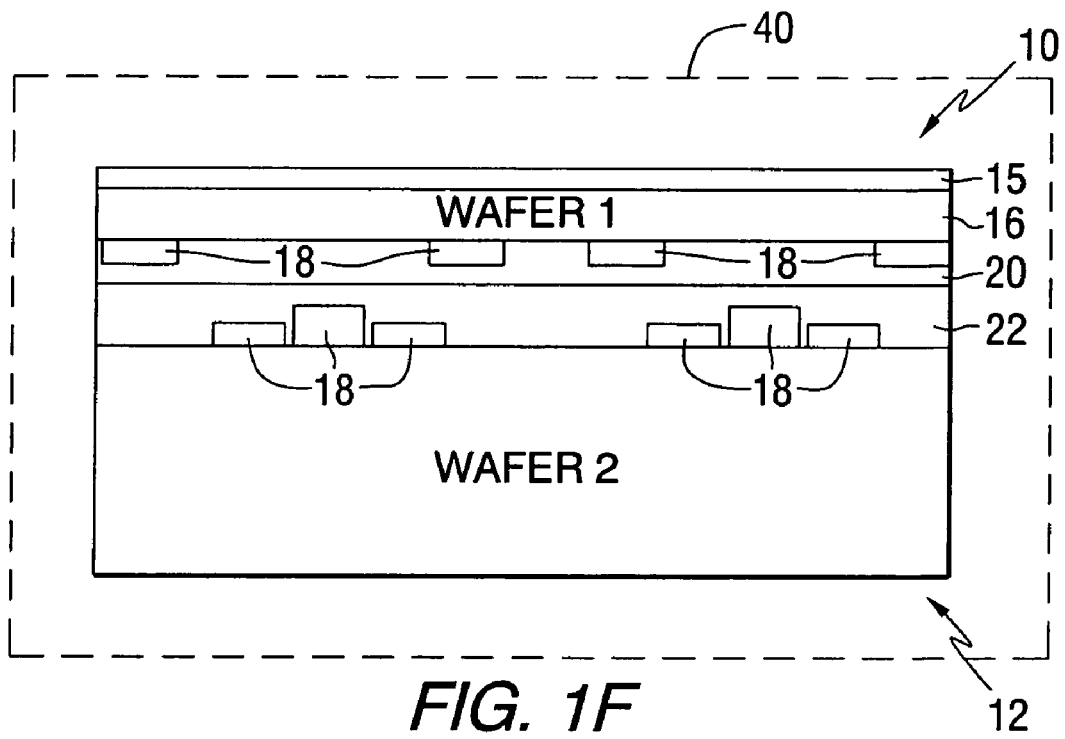

Once the silicon layer 14 is of uniform thickness, in the range of around 10 to 25 μm, it is placed into a chamber 40, as indicated in FIG. 1F. Thereafter it is subjected to a plasmaless etching process with the $XeF_2$ or $BrF_3$ to remove the remaining silicon. The exposed oxide resulting from this step will be of uniform thickness. As the thickness of the silicon layer approaches the oxide layer its selectivity will be very high, around 5,000 or greater. This means that the etching process will come to a virtual stop when the oxide is reached. The finished structure may then be removed from the chamber 40 for further processing.

Figure 1G:
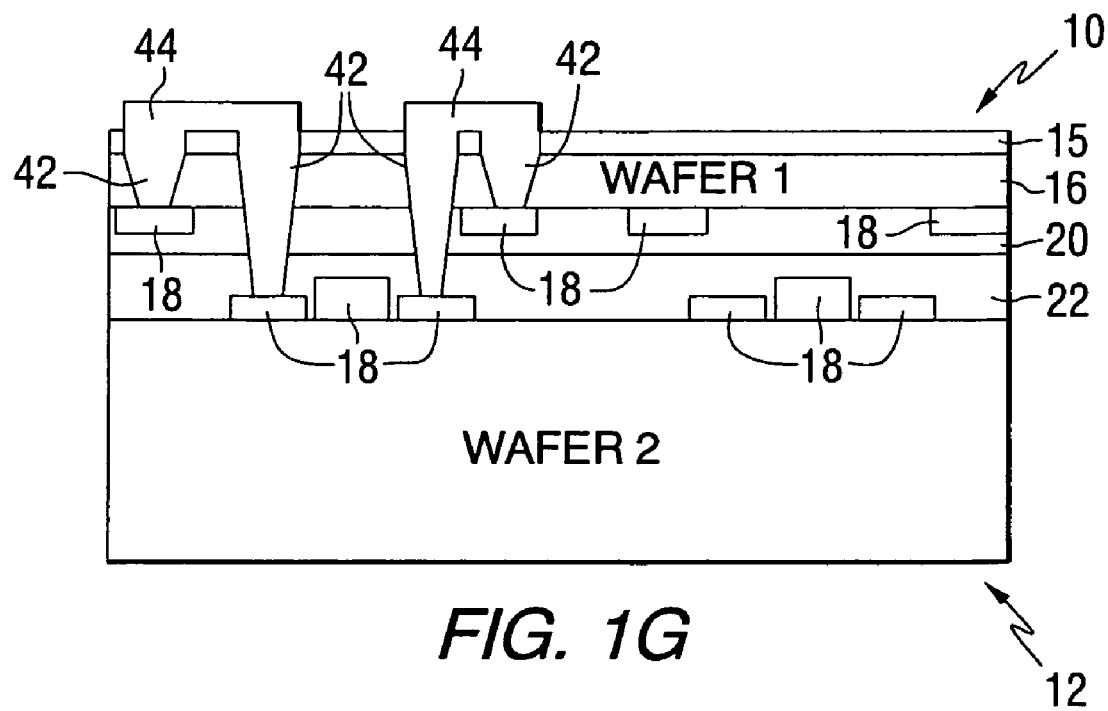

An example of such further processing is illustrated in FIG. 1G. After removal from chamber 40 vias 42 are formed in the wafers, are filled with conductive metal 44 for making various electrical contact with devices 18. If the wafers originally did not include such devices 18, then the finished structure may be further processed such as by adding various devices, or even removing the remaining oxide layer 15, if desired.

Benefits of using the plasmaless dry echants described herein include no post etching clean up and no surface tension forces, which normally occur with wet chemical etching. Further, the etch is isotropic and is conducted at room temperature. With the plasmaless dry etch as the final step in the wafer preparation, the charging effects associated with plasma etches are eliminated.

Figure 3:
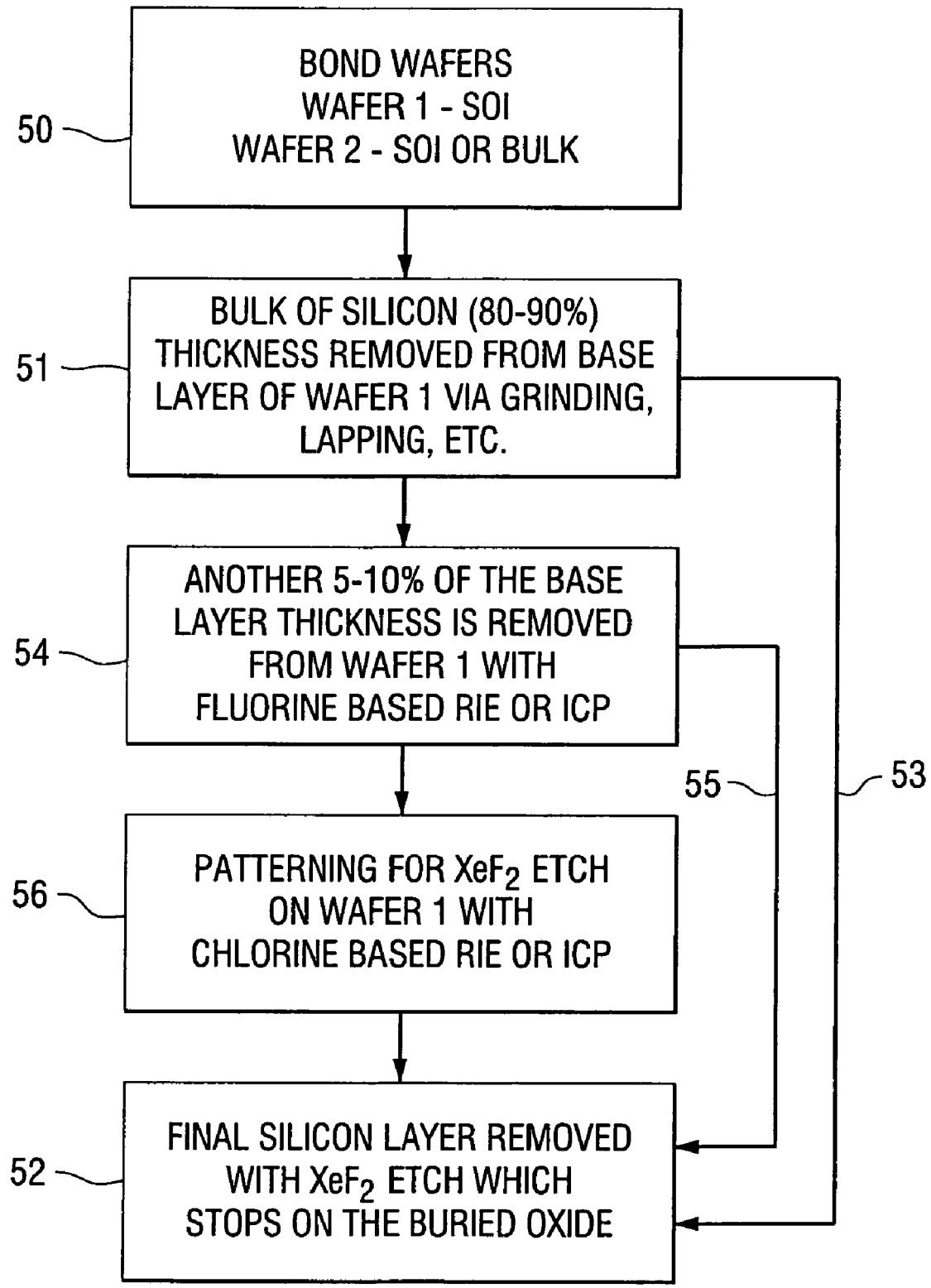
FIG. 3 is a block diagram flow chart of the process.

A flow diagram for the process is illustrated in FIG. 3. As depicted by block 50 the two wafers 10 and 12, at least one of which is an SOI structure, are bonded together. In block 51 the bonded structure is mechanically reduced in thickness by removing around 80% to 90% of the silicon by grinding or lapping. At this stage the structure may be subject to the final silicon removal by $XeF_2$ (or $BrF_3$) as shown by block 52 and indicated by path 53.

If path 53 is not taken, the silicon layer is reduced to around 10 to 25 μm by a plasma operation with fluorine, as shown in block 54. If the resulting uneven wafer surface is acceptable then the structure may be subject to the final silicon removal by $XeF_2$ (or $BrF_3$) as shown by block 52 and indicated by path 55. If a uniform thickness is desired, then a subsequent plasma etch in chlorine of the wafer, patterned with resist, is performed, as indicated by block 56, after which the final step of block 52 is performed.

The foregoing detailed description merely illustrates the principles of the invention. It will thus be appreciated that those skilled in the art will be able to devise various arrangements which, although not explicitly described or shown herein, embody the principles of the invention and are thus within its spirit and scope.

What is claimed is:

1. A method of thinning a semiconductor structure, comprising the steps of:
   providing a first semiconductor structure having a first layer of silicon, an intermediate layer of an oxide of silicon and a third layer of silicon, said third layer having an outer surface;
   providing a second semiconductor structure also having an outer surface;
   providing a coating of predetermined material on said outer surface of said third layer of silicon and on said outer surface of said second semiconductor structure;
   bonding said first and second semiconductor structures together at said coatings;
   mechanically removing around 80% to 90% of said first layer of silicon;
   after said removal of around 80% to 90% of said first layer of silicon, removing the remaining first layer of silicon to a thickness of no less than around 10 mm, by a first plasma etch; and
   subjecting the remainder of said first layer to a plasmaless dry etch of a fluorine containing compound so as to remove any remaining first silicon layer and to expose the surface of said intermediate layer of oxide.

2. A method according to claim 1 and including the step of performing a second plasma etch of said first layer of silicon after said first plasma etch to compensate for any uneven reduction in thickness resulting from said first plasma etch.

3. A method according to claims 1 or 2 wherein the plasmaless dry etch comprises the step of subjecting the remaining said first layer to a plasmaless dry etch of XeF2 to remove any remaining first silicon layer and to expose the surface of said intermediate of oxide.

4. A method according to claims 1 or 2 wherein the plasmaless dry etch comprises the step of subjecting the remaining said first layer to a plasmaless dry etch of BrF3 to remove any remaining first silicon layer and to expose the surface of said intermediate of oxide.

5. A method according to claim 1 wherein the first plasma etching comprises performing said first plasma etch with a fluorine based gas.

6. A method according to claim 2 wherein the second plasma etch step comprises performing said second plasma etching with a chlorine based gas.

7. A method according to claims 1 or 2 mechanically removing around 80% to 90% of said first layer of silicon comprises removing said first layer by a grinding operation.

8. A method according to claims 1 or 2 mechanically removing around 80% to 90% of said first layer of silicon comprise removing said first layer by a lapping operation.

9. A method according to claim 1 and further including the step of placing a plurality of semiconductor devices on at least one of said semiconductor structures prior to said step of bonding said first and second semiconductor together.

10. A method according to claim 1 and further including the steps of
    forming vias through said intermediate layer of oxide; and,
    after said surface of said intermediate layer of oxide is exposed, metallizing said vias.

11. A method according to claim 2 wherein said first plasma etch creates an uneven thickness of said silicon which includes a central portion of a certain thickness which is greater than the thickness of a surrounding annular area and additionally including the step of masking said annular area prior to performing said second plasma etch so that said annular area is unaffected by said second plasma etch.

12. A method according to claims 1 or 2 coating said outer surface of said third layer of silicon and said outer surface of said second semiconductor structure comprises coating said outer surfaces with an oxide so as to provide oxide surfaces.

13. A method according to claim 12 and additionally including the step of chemically or mechanically polishing said oxide surfaces prior to said step of bonding said first and second semiconductor structures together.

14. A method according to claim 13 wherein said step of bonding includes annealing so as to covalently bond said oxide surfaces together.

* * * * *